US006593182B2

(12) United States Patent
Chen

(10) Patent No.: US 6,593,182 B2
(45) Date of Patent: Jul. 15, 2003

(54) METHOD FOR FORMING MULTIPLE GATE OXIDE LAYER WITH THE PLASMA OXYGEN DOPING

(75) Inventor: Wei-Wen Chen, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 119 days.

(21) Appl. No.: 09/811,689

(22) Filed: Mar. 19, 2001

(65) Prior Publication Data

US 2003/0022435 A1 Jan. 30, 2003

(51) Int. Cl.$^7$ .................................... H01L 21/8242
(52) U.S. Cl. ........................................ 438/241
(58) Field of Search ....................... 438/787, 788, 438/287, 305, 769, 770, 241, 480, 481, 485

(56) References Cited

U.S. PATENT DOCUMENTS 5,930,658 A * 7/1999 Ibok ........................ 438/482
6,027,997 A * 2/2000 Mogami ................... 438/287
6,146,948 A * 11/2000 Wu et al. .................. 438/275
6,335,262 B1 * 1/2001 Crowder et al. ........... 438/440
6,319,759 B1 * 11/2001 Furukawa et al. ......... 438/151
6,337,240 B1 * 1/2002 Chu ......................... 438/241

* cited by examiner

*Primary Examiner*—David Nelms
*Assistant Examiner*—Quoc Hoang
(74) *Attorney, Agent, or Firm*—Powell Goldstein Frazer & Murphy LLP

(57) ABSTRACT

First of all, a semiconductor substrate is provided, and then a photoresist layer is formed and defined on the semiconductor substrate. The pulsed plasma doping is then performed by the photoresist layer as a mask to form a doping region and an undoping region on the semiconductor substrate. After removing the photoresist layer, performing a thermal oxidation process to form a thick gate oxide layer in the doping region and a thin gate oxide layer in the undoping region. Subsequently, two gates are respectively formed on the thick gate oxide layer and the thin gate oxide layer by means of the conventional process.

31 Claims, 9 Drawing Sheets

METHOD FOR FORMING MULTIPLE GATE OXIDE LAYER WITH THE PLASMA OXYGEN DOPING

BACKGROUND OF THE INVENTION

1. Field of the Invention

The present invention relates generally to a method for forming a gate oxide layer, and more particularly to a method for forming a multiple gate oxide layer with the oxygen plasma doping.

2. Description of the Prior Art

As semiconductor devices, such as Metal-Oxide-Semiconductor (MOS) devices, become highly integrated, the area occupied of the chip has to be maintained or more less, so as to reduce the unit cost of the circuit. For corresponding with the development of the high technology industry in the future, there is only one method to achieve this objective, that is, the area occupied by the devices shrinks, as well as the design rule. With advances in the semiconductor technology, the dimensions of the integrated circuit (IC) devices have been shrunk to the deep sub-micron range. As the semiconductor device continuously shrinks to deep sub-micron region, some problems are incurred due to the process of scaling down.

Integrated circuits (IC) are generally constructed from a combination of different devices and isolating structures. The devices are separated from each other through the isolating structures. The most commonly employed isolating structures include shallow trench isolation (STI). For example, the shallow trench isolation separates an input/output (I/O) device area from a core device area. After the formation of an isolation structure, a gate oxide layer is normally formed over the substrate surface. This gate oxide layer serves to facilitate the subsequent formation of a gate or connecting lines. Since a larger voltage is required for controlling the devices in an input/output area compared to a core device area, the input/output area must have a thicker gate oxide layer. Therefore, a thicker gate oxide layer must be formed in the input/output area to protect the devices against any adverse effects caused by a high operating voltage.

In the industry of integrated circuit (IC), it is necessary that the thickness of the dual gate oxide layer or the multiple gate oxide layer is integrated into the simple integrated circuit (IC). The microcontroller units (MCUs) and the digital signal processor (DSPs) use several skill in the simple integrated circuit (IC), such as high speed logic, static random access memory (SRAM), dynamic random access memory (DRAM), nonvolatile memory (NVM). Hence, the process for forming multiple gate dielectric layer in many devices is necessary.

FIGS. 1A through 1D are cross-sectional views showing the progression of manufacturing steps in the formation of the metal-oxide-semiconductor with a dual gate oxide layer according a conventional method. First of all, a substrate 100 is provided, and a shallow trench isolation 110 is formed in the substrate 100. Then, a first gate oxide layer 120 having an uniform thickness is formed on the substrate 100 by way of thermal oxidation. Thereafter, a photoresister layer 130 is formed over a partial of the first gate oxide layer 120. Afterward, removing the portion of the first gate oxide layer 120 without the photoresist layer 130 thereon. Subsequently, removing the photoresist layer 130, and then proceeding the thermal oxidation process again to form a thin gate oxide layer that is the second gate oxide layer 140 on the substrate 110 and a thick gate oxide layer 150 that is the third gate oxide layer on the first gate oxide layer 120. Finally, a first gate 160 is formed on the second gate oxide layer 140 and a second gate 170 is formed on the third gate oxide layer 150, wherein the first gate 160 is a core cell, and the second gate 170 is a I/O buffer region.

According to the conventional process for forming the dual gate oxide layer, as above discussed, there are issues in the conventional process, as follows: firstly, the gate oxide layer of the conventional is formed by way of the furnace process, it has to cost the process time about 6 to 8 hours to complete one batch, so that the throughput can not be increased; secondly, one thickness has to use one photoresist layer, hence, the various thickness of the gate oxide layer that are formed by repeatedly perform the lithography process and oxidation process have consume, hence, the lithography process and oxidation process must be repeatedly performed to form the various thickness of the gate oxide layer, so that the process cost is expensive, and the quality and reliability can not also be increased. Moreover, another method for forming gate oxide layer is performed by ion implantation. If the implanting region is over deep, it will affect the device to cause the channel effect.

In accordance with the above description, a new and improved method for forming the gate dielectric layer is therefore necessary, so as to raise the yield and quality of the follow-up process.

SUMMARY OF THE INVENTION

In accordance with the present invention, a method is provided for fabricating the gate dielectric layer that substantially overcomes drawbacks of above mentioned problems arised from the conventional methods.

Accordingly, it is a main object of the present invention to provide a method for fabricating the gate dielectric layer. This invention can use the plasma doping and the thermal oxidation only in one time to substitute for repeatedly proceeding conventional thermal oxidation, so as to reduce times of the lithography process and simplify complex process. This invention can also avoid causing issues of thermal oxidation in many times. Hence, the present invention is appropriate for deep sub-micron technology to provide the semiconductor devices.

Another object of the present invention is to provide a method for forming the gate dielectric layer. The present invention can form an ultra shallow ion-implanting region on the substrate by way of the pulse plasma doping, so as to increase the thickness of gate dielectric layer in follow-up process. Furthermore, this invention can also use various dosage and undoping region with the thermal process only in one time to form the gate dielectric layer having various thickness. Accordingly, this invention can provide a semiconductor device whose performance is better than the conventional one, so as to increase yield and quality of the process and, hence, decrease cost. Therefore, the present invention can correspond to economic effect.

Still another object of the present invention is to provide a method for forming a gate oxide layer with various thicknesses. The present invention can obtain a shallow dosage profile by way of the pulse plasma doping, that is the pulse plasma doping can drive the oxygen to close to the surface of the substrate, so as to avoide the channel of the devices. Furthermore, this method can also reduce the destructiveness of the substrate so that the damage is easy to be repaired during thermal oxidation process, so as to acquire an interface between silicon and silicon oxide in the integrity.

In accordance with the present invention, a new method for forming semiconductor devices is disclosed. First of all, a semiconductor substrate is provided, and then a photoresist layer is formed and defined on the semiconductor substrate. The pulse plasma doping is then performed by the photoresist layer as a mask to form a doping region and an undoping region on the semiconductor substrate. After removing the photoresist layer, performing a thermal oxidation process to form a thick gate oxide layer in the doping region and a thin gate oxide layer in the undoping region. Subsequently, two gates are respectively formed on the thick gate oxide layer and the thin gate oxide layer by means of the conventional process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
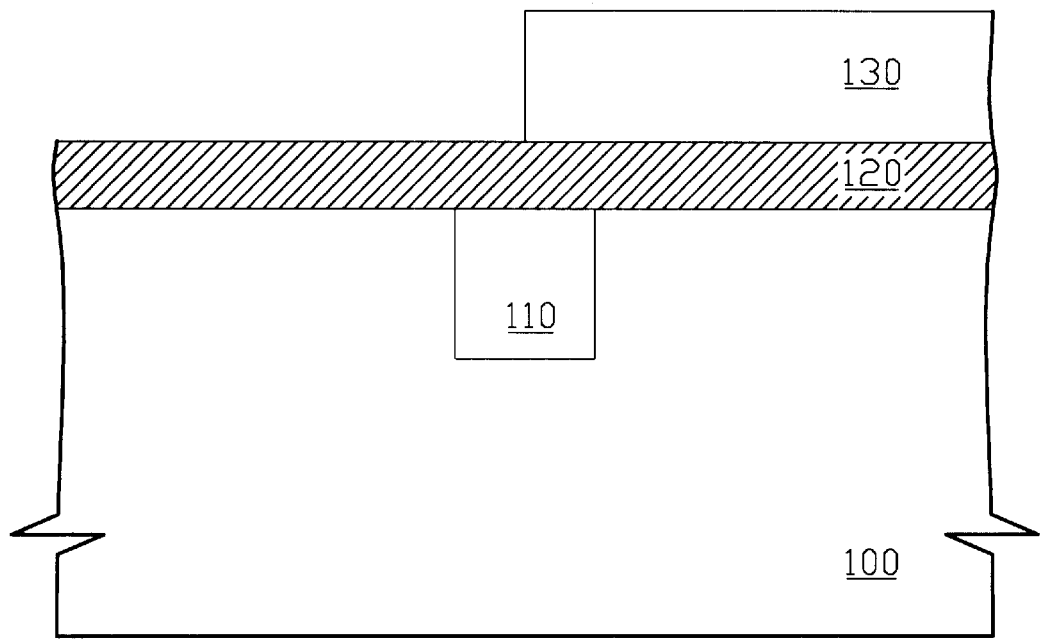
FIG. 1A to FIG. 1D show cross-sectional views illustrative of the metal-oxide-semiconductor by way of using the conventional process.
Figure 1B:
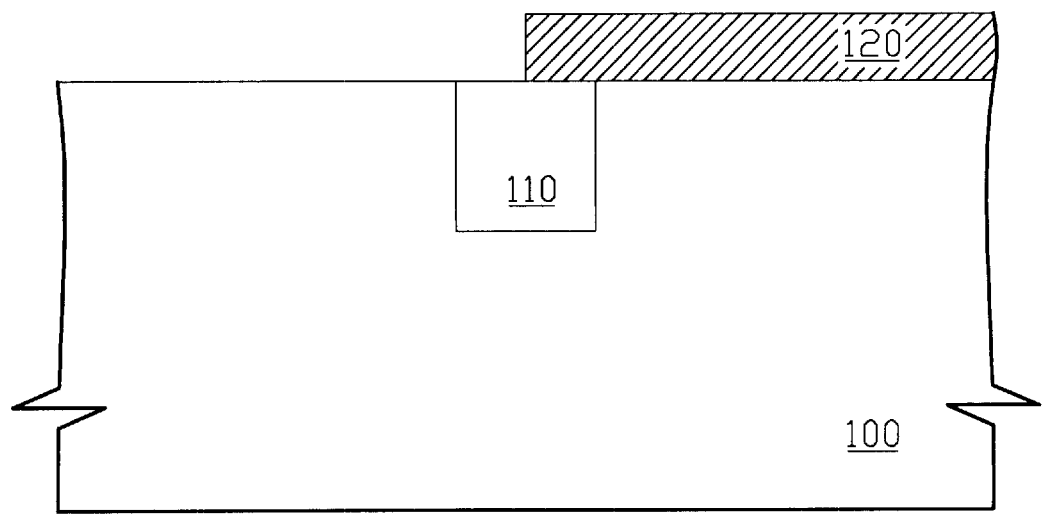
Figure 1C:
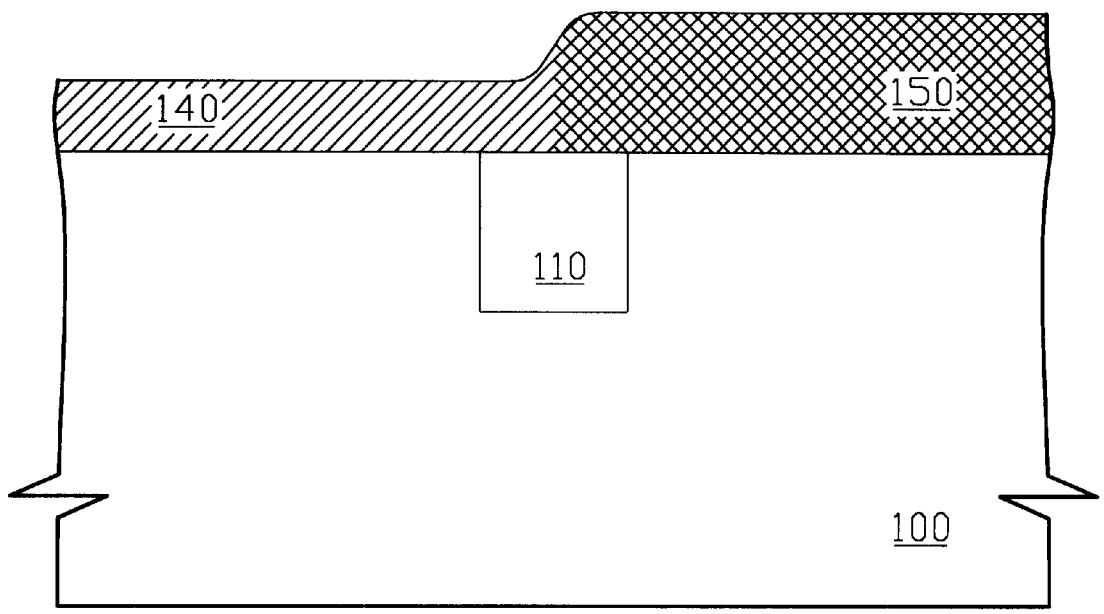
Figure 1D:
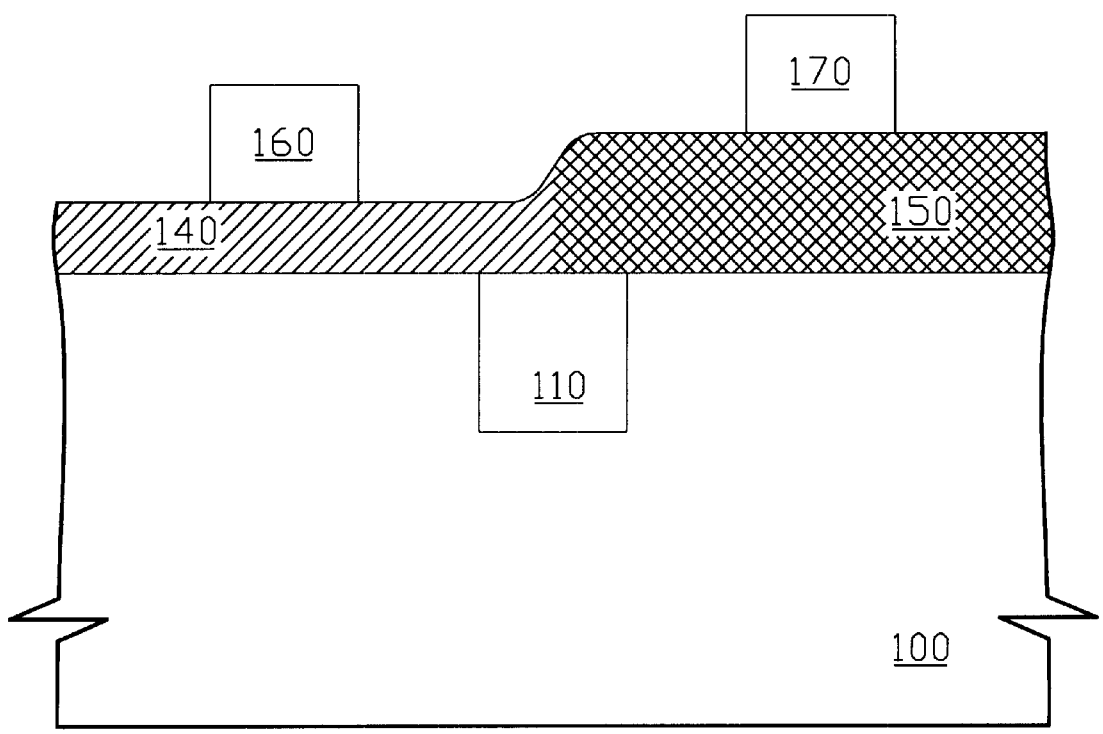
Figure 2A:
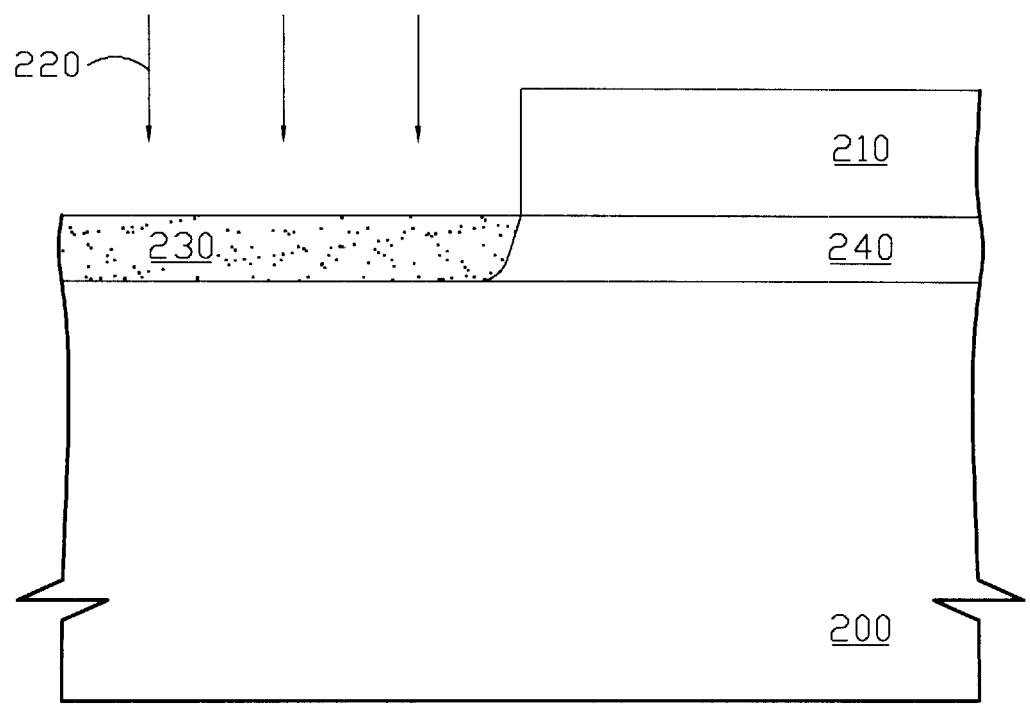
FIG. 2A to FIG. 2B show cross-sectional views illustrative of various stages for forming a dielectric layer having various thickness in accordance with the first embodiment of the present invention.
Figure 2B:
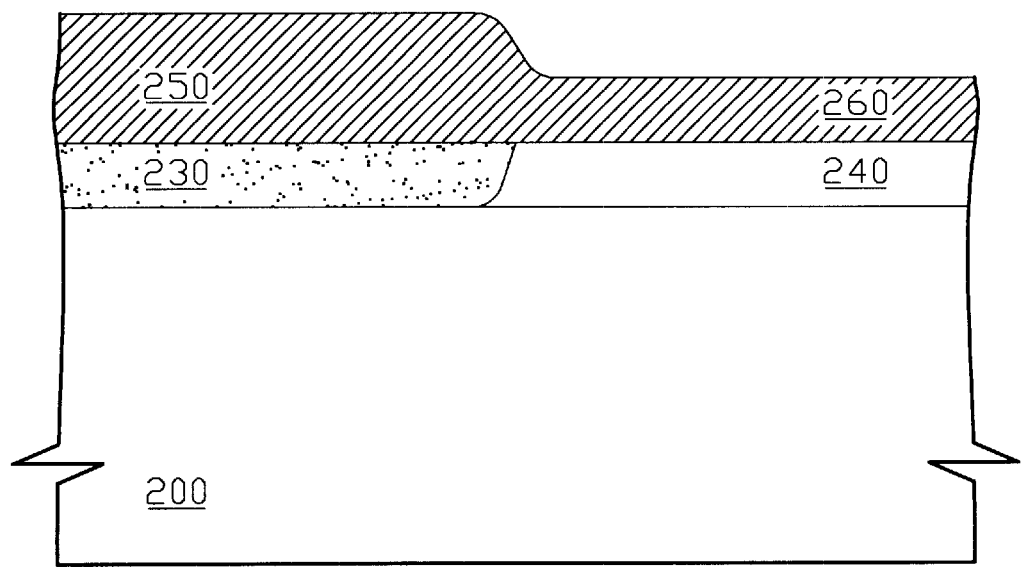

As illustrated in FIG. 2A and FIG. 2B, in the first embodiment of the present invention, first of all, a semiconductor substrate 200 is provided, and then a photoresist layer 210 is formed and defined on the semiconductor substrate 200. The plasma doping process 220 is then performed by the photoresist layer 210 as a mask to form a doping region 230 and an undoping region 240 on the semiconductor substrate 200. After removing the photoresist layer 210, performing a thermal process to form a thick dielectric layer 250 on the doping region 230 and a thin dielectric layer 260 on the undoping region 240. Subsequently, two gates are respectively formed on the thick gate oxide layer and the thin gate oxide layer by means of the conventional process.

Figure 3A:
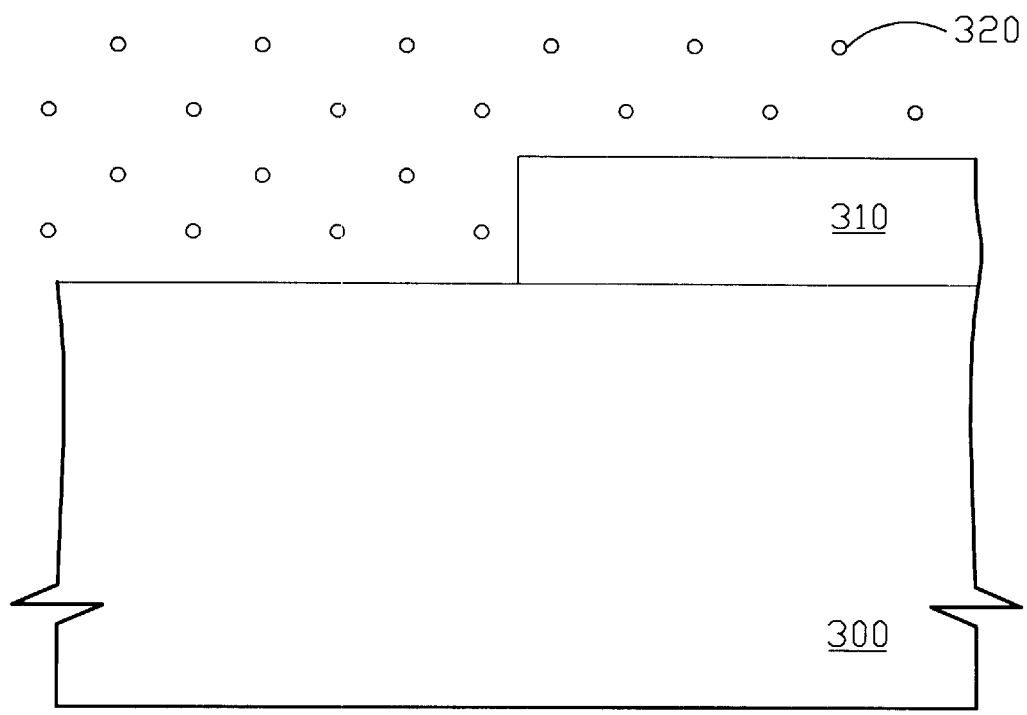
FIG. 3A to FIG. 3C show cross-sectional views illustrative of various stages for forming a gate dielectric layer having various thickness in accordance with the second embodiment of the present invention.
Figure 3B:
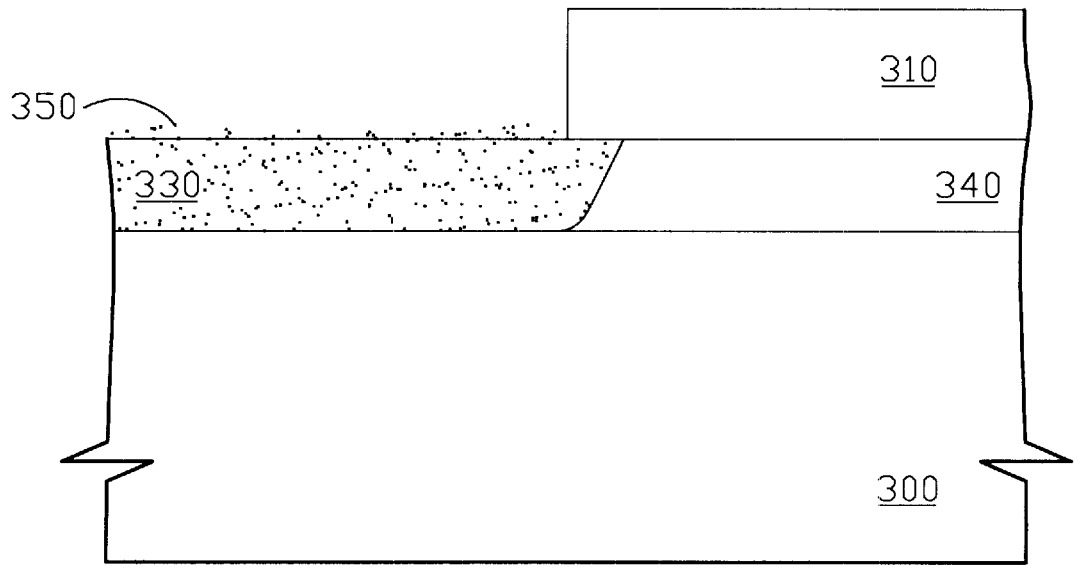

As illustrated in FIG. 3A, in the second embodiment of the present invention, first of all, a semiconductor substrate 300 is provided, and then a photoresist layer 310 is formed and defined on the semiconductor substrate 300. The structure of above is placed into the reaction chamber, and then a reactive gas 320 is flowed into the reaction chamber. Next, the plasma doping process is performed by the photoresist layer 310 as a mask to form a doping region 330 and an undoping region 340 on the semiconductor substrate 300, wherein the plasma doping process will be generated when a negative bias is applied to form the plasma ions 350, and then the plasma ions 350 is absorbed on the doping region 330, as shown in FIG. 3B.

Figure 3C:
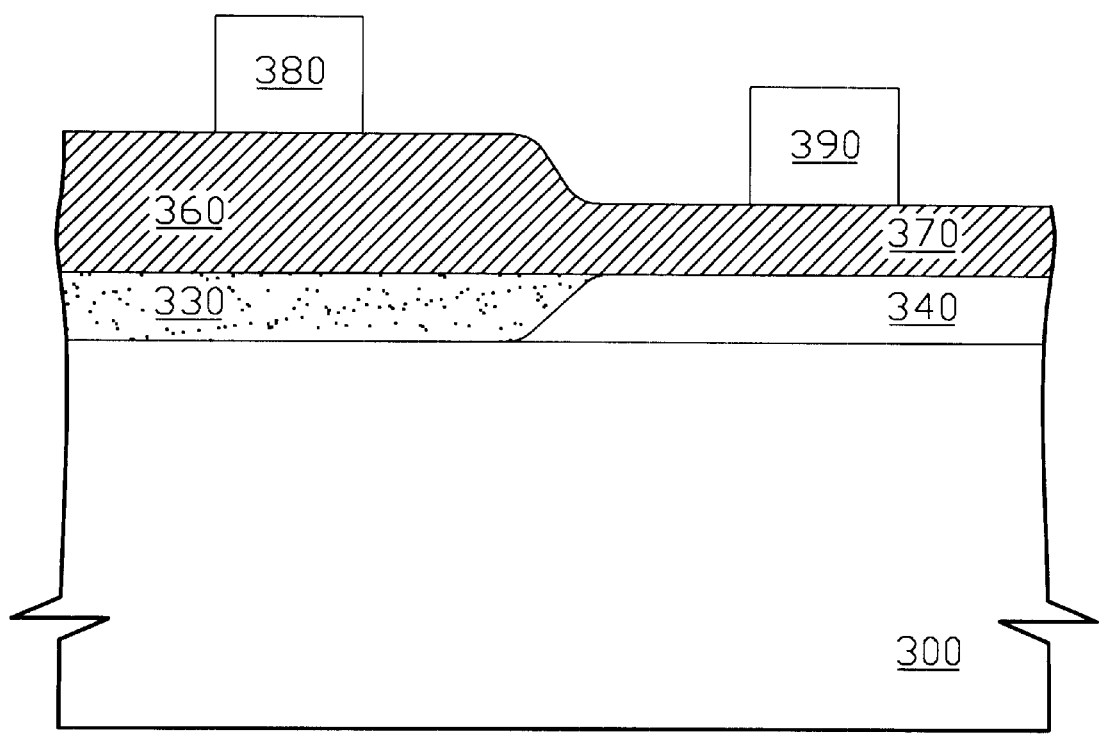

As illustrated in FIG. 3C, in this embodiment, after removing the photoresist layer 310, performing a thermal process to form a thick gate dielectric layer 360 in the doping region 330 and a thin gate dielectric layer 370 in the undoping region 340, wherein the thermal process comprises a furnace process. Finally, a gate 380 is formed on the thick gate dielectric layer 360 and another gate 390 is formed on the thin gate dielectric layer 370 by means of the conventional process, respectively.

Figure 4A:
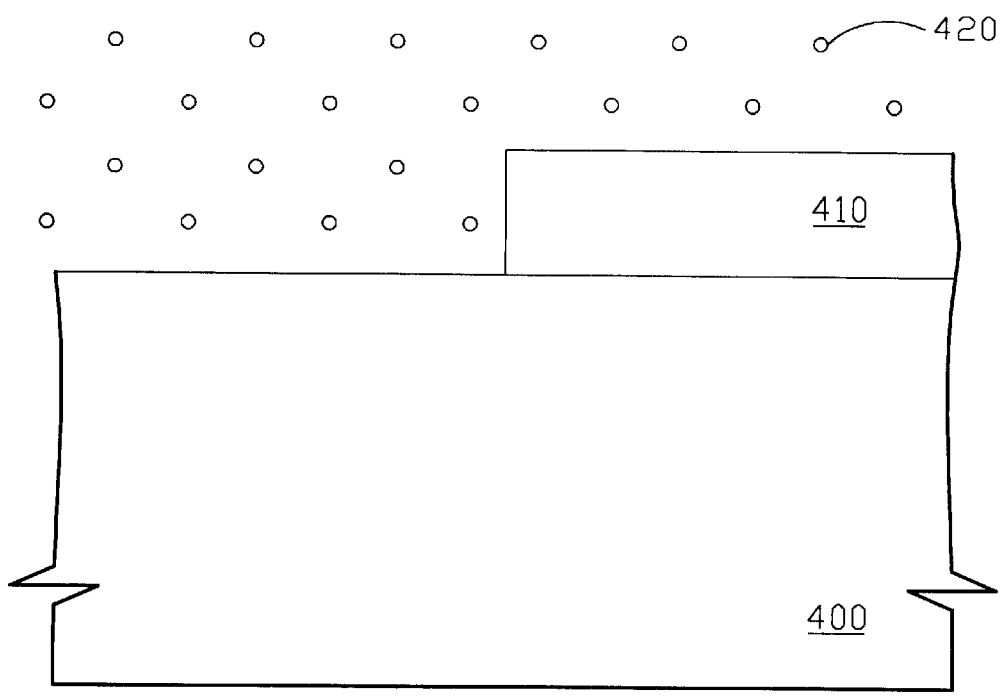
FIG. 4A to FIG. 4C show cross-sectional views illustrative of various stages for forming a gate oxide layer having various thickness in accordance with the third embodiment of the present invention.
Figure 4B:
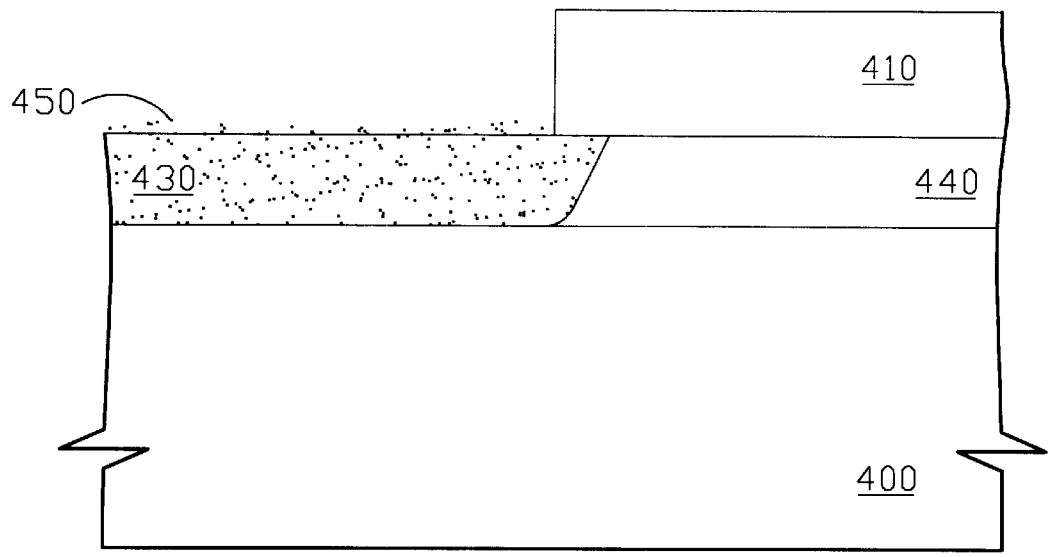

As illustrated in FIG. 4A, in the third embodiment of the present invention, first of all, a silicon substrate 400 is provided, and then a photoresist layer 410 is formed and defined on the silicon substrate 400. The structure of above is placed into the reaction chamber, and then an oxygen 420 is flowed into the reaction chamber. Next, the pulse plasma doping process is performed by the photoresist layer 410 as a mask to form a doping region 430 and an undoping region 440 on the silicon substrate 400, wherein the pulse plasma doping process will be generated when a negative bias is applied, so as to separate positive ions 450 from oxygen 420, and then the positive ions 450 is absorbed on the doping region 430, and oxygen doping energy is about 200 eV to 10000 eV, and the thickness of the doping region is less than 60 Å, as shown in FIG. 4B.

Figure 4C:
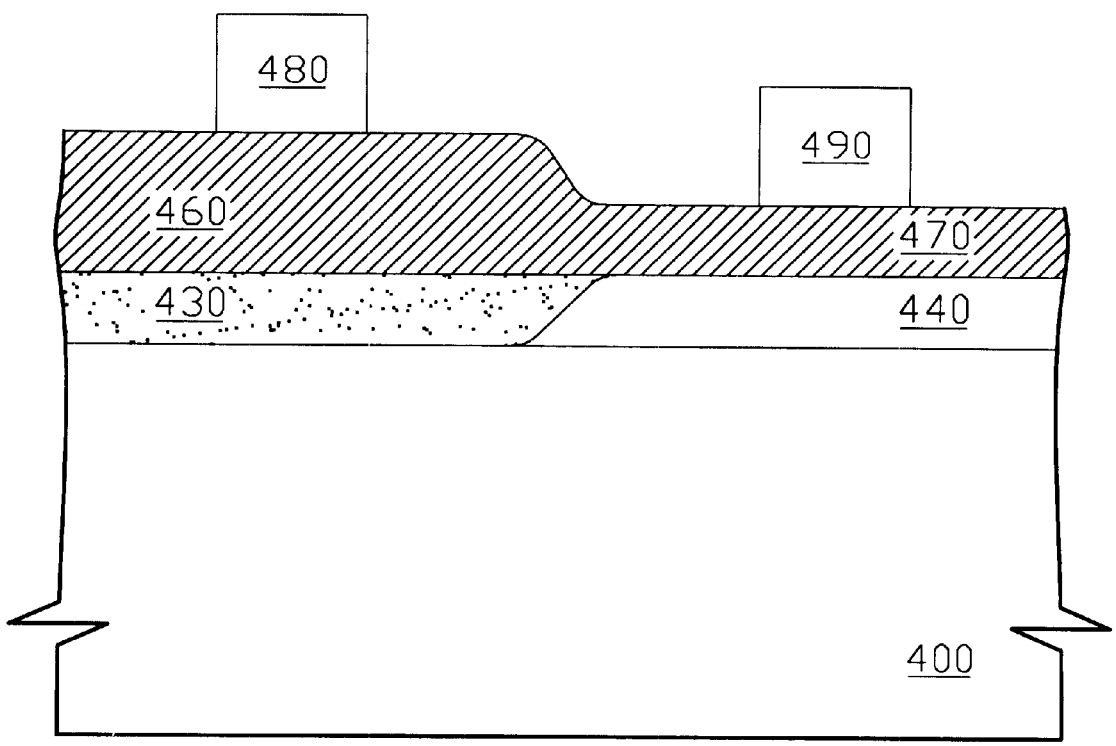

As illustrated in FIG. 4C, in this embodiment, after removing the photoresist layer 410, performing a thermal oxidation process to form a thick gate oxide layer 460 in the doping region 430 and a thin gate oxide layer 470 in the undoping region 440, wherein the thermal oxidation process comprises a drying oxidation process or a wetting oxidation process, and the temperature of the thermal oxidation process is about 700° C. to 1000° C., and gate oxide layer comprises a silicon oxide layer. Finally, a poly gate 480 is formed on the thick gate oxide layer 460 and another poly gate 490 is formed on the thin gate oxide layer 470 by means of the conventional process, respectively.

Figure 5A:
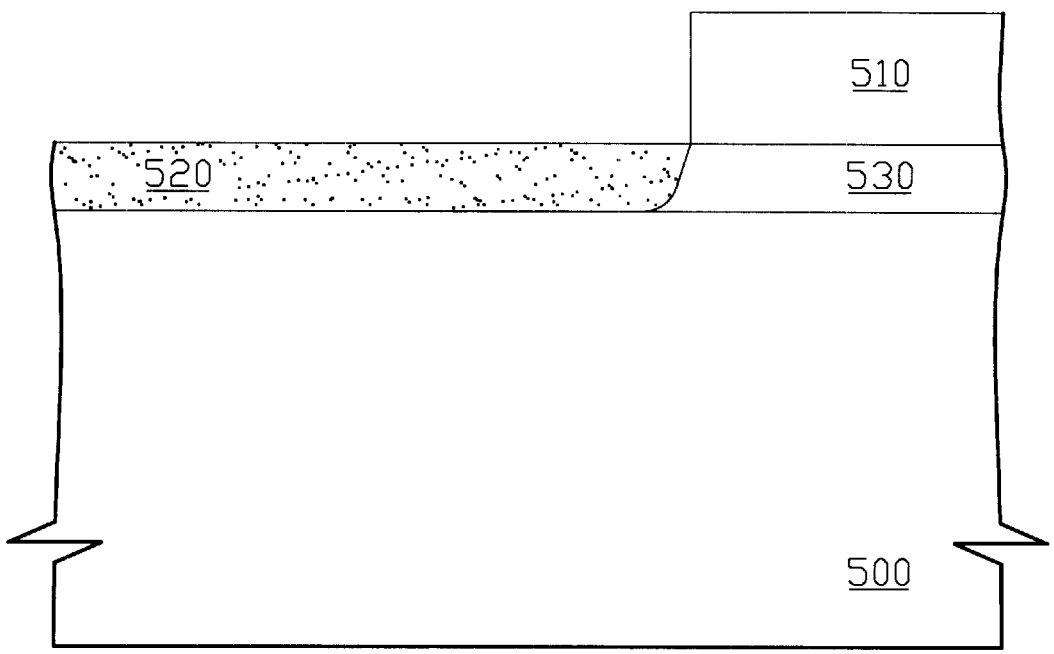
FIG. 5A to FIG. 5D show cross-sectional views illustrative of various stages for forming a metal-oxide-semiconductor device having a plurality of gates in accordance with the fourth embodiment of the present invention.
Figure 5B:
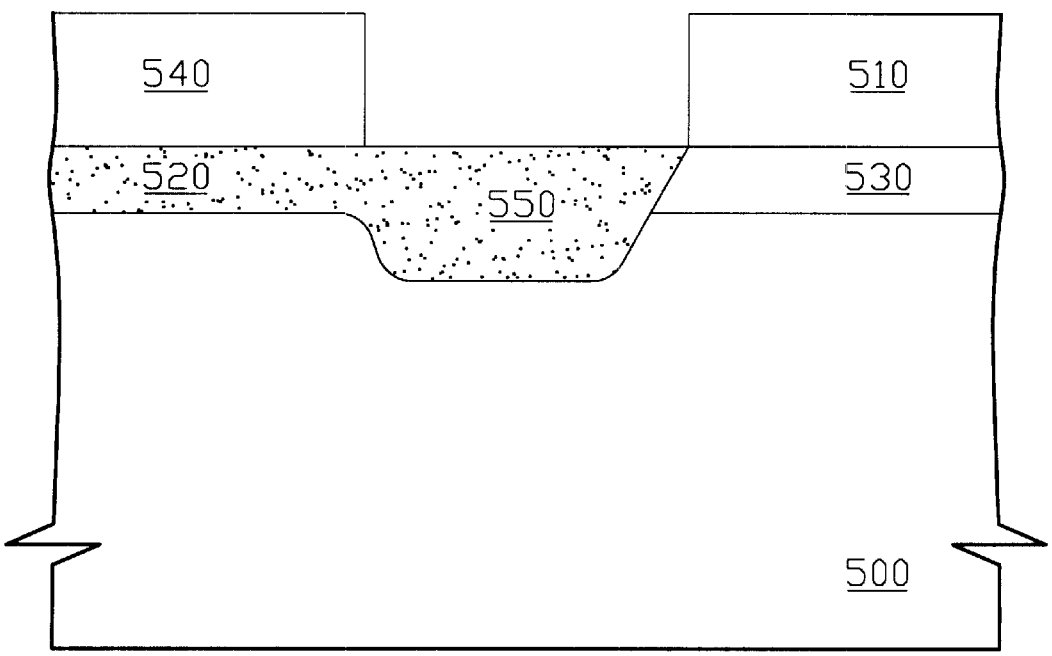

As illustrated in FIG. 5A, in the fourth embodiment of the present invention, first of all, a substrate 500 is provided, and then a first photoresist layer 510 is formed and defined on the substrate 500. Then the pulsed oxygen plasma doped process is performed by the first photoresist layer 510 as a mask to form a first doping region 520 and an undoping region 530 on the substrate 500, wherein the dosage of the pulsed oxygen plasma doped process is about between $10^{13}/cm^2$ and $10^{15}/cm^2$. Afterward, a second photoresist layer 540 is formed and defined on a partial surface of the first doping region 520. Next, the pulsed oxygen plasma doped process is performed by the first photoresist layer 510 and the second photoresist layer 510 as two masks to form a second doping region 550 on the partial surface of the the first doping region 520, wherein the dosage of the pulsed oxygen plasma doped process is about $10^{13}/cm^2$ to $10^{15}/cm^2$, and the thickness of the first doping region 520 is less then the thickness of the second doping region 550, as shown in FIG. 5B.

Figure 5C:
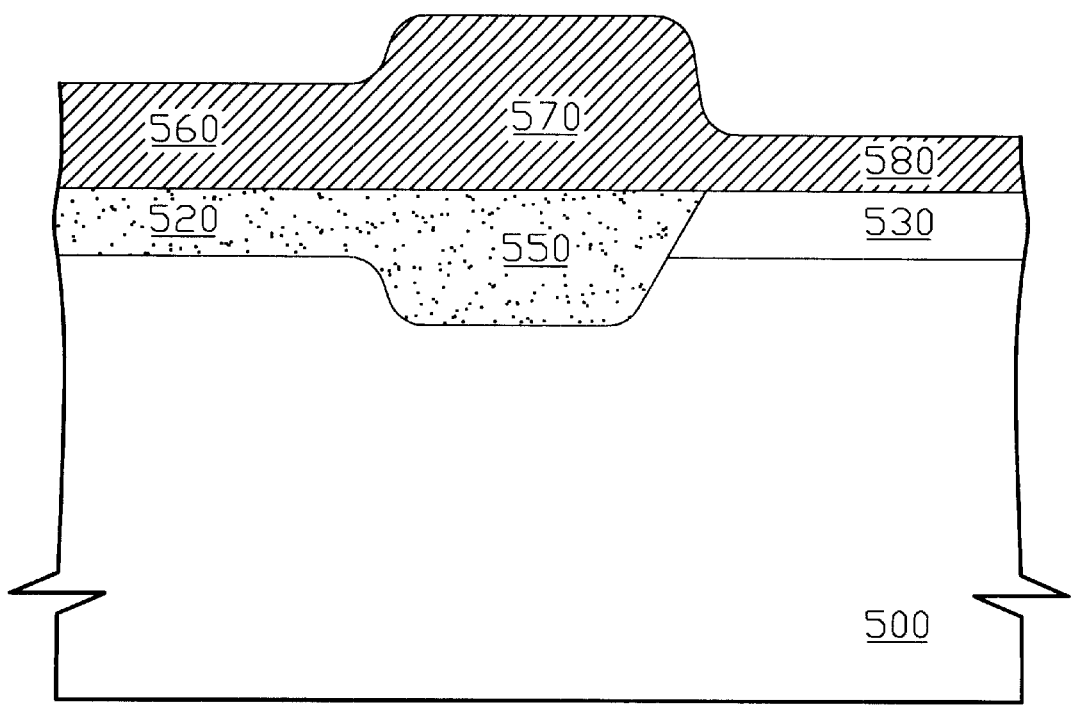
Figure 5D:
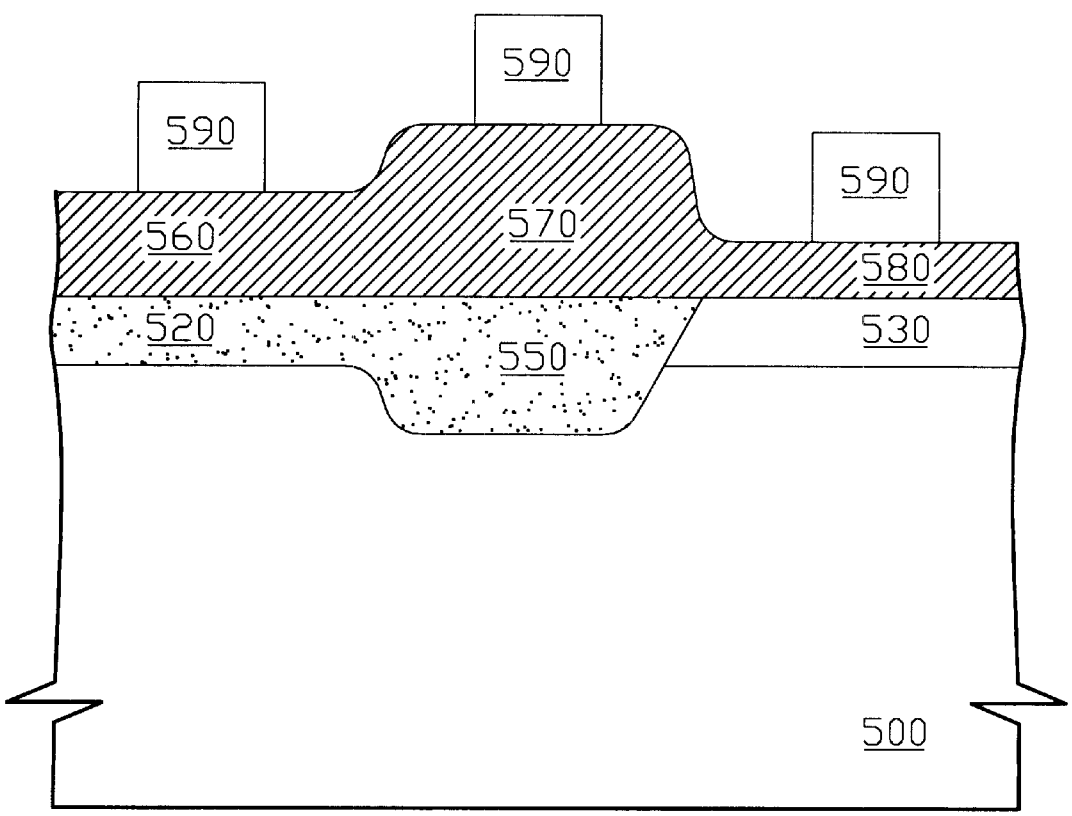

As illustrated in FIG. 5C, in this embodiment, after removing the first photoresist layer 510 and second photoresist layer 540, performing a drying oxidation process to form a first gate oxide layer 560 having a first thickness in the first doping region 520, a second gate oxide layer 570 having a second thickness in the second doping region 550, and a third gate oxide layer 580 having a third thickness in the undoping region 530. Finally, respectively, a poly gate 590 is formed on the first gate oxide layer 560, the second gate oxide layer 570 and the third gate oxide layer 580 by means of the conventional process, as shown in FIG. 5D.

In these embodiments of the present invention, as discussed above, the present invention provides a method for forming a gate oxide layer. This invention can use the plasma doping and the thermal oxidation only in one time to substitute for repeatedly proceeding conventional thermal oxidation, so as to reduce times of the lithography process and simplify complex process. This invention can also avoid causing issues of thermal oxidation in many times. Hence, the present invention is appropriate for deep sub-micron technology to provide the semiconductor devices. Furthermore, the plasma doped process directly uses the plasma ions that flow into the reaction chamber to react, whereby forming a reacted boundary layer on the surface of the substrate, and the boundary layer will be changed in according with the variation of the concentration. On the contrary, the concept for pulsed plasma doping is using the gas flow into the reaction chamber with intermittent voltage method that is controlled by add/non-add voltage, so as to separate positive ions from the gas, and then the positive ions move forward to the substrate surface so that the boundary layer is uniform and steady-state. Accordingly, the driving force can be controlled to keep constant. Therefore, the present invention can obtain a shallow dosage profile by way of the pulse plasma doping, that is the pulse plasma doping can drive the oxygen to close to the surface of the substrate, so as to avoid the channel of the devices. Hence, this method can also reduce the destructiveness of the substrate so that the damage is easy to be repaired during thermal oxidation process, so as to acquire an interface between silicon and silicon oxide in the integrity. Moreover, the pulsed plasma doping in this invention not only could form an ultra shallow ion-implanting region on the substrate, but also increase the thickness of gate dielectric layer in follow-up process. Furthermore, this invention can also use various dosage and undoping region with the thermal process only in one time to form the gate dielectric layer having various thicknesses. Accordingly, this invention can provide a semiconductor device whose performance is better than the conventional device, so as to increase yield and quality of the process and, hence, decrease cost. On the other hand, the present invention can correspond to economic effect.

Of course, it is possible to apply the present invention to the process for forming the oxide layer, and also it is possible to the present invention to any one dielectric layer in the semiconductor devices. Also, this invention can be applied to use pulsed plasma doping concerning the metal-oxide-semiconductor process used for forming dielectric layer have not been developed at present. Method of the present invention is the best gate oxide layer compatible process for deep sub-micro process.

Obviously, many modifications and variations of the present invention are possible in light of the above teachings. It is therefore to be understood that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for forming a dielectric layer having various thickness, said method comprising:

providing a substrate;

forming and defining a photoresist layer on said substrate;

performing a plasma doping process by said photoresist layer as a mask to form a doping region and an undoping region on said substrate, wherein said thickness of said dielectric layer located on said doping region is more than the thickness of said dielectric layer located on said undoping region;

removing said photoresist layer; and forming a dielectric layer with various thickness on said doping region and said undoping region.

2. The method according to claim 1, wherein said plasma doping process comprises a pulsed plasma doping process.

3. The method according to claim 1, wherein the method for forming said dielectric layer comprises a thermal process.

4. The method according to claim 3, wherein said thermal process comprises a furnace process.

5. A method for forming a gate dielectric layer, said method comprising:

providing a substrate;

forming and defining a photoresist layer on said substrate;

placing said substrate having said photoresist layer into a reaction chamber, and then flowing a reactive gas into said reaction chamber;

performing a oxygen plasma doping process by said photoresist layer as a mask to form a doping region and an undoping region on said substrate;

removing said photoresist layer;

placing said substrate having said doping region and said undoping region into a furnace, and then performing a thermal process with said reactive gas to form a first gate dielectric layer on said doping region and a second gate dielectric layer on said undoping region; and forming a first gate on said first gate dielectric layer and a second gate on said second gate dielectric layer.

6. The method according to claim 5, wherein said substrate comprises a silicon material.

7. The method according to claim 5, wherein said reactive gas comprises an oxygen.

8. The method according to claim 5, wherein said oxygen plasma doping process comprises a pulsed plasma oxygen doping process.

9. The method according to claim 8, wherein said pulsed plasma doping process comprises a negative bias to separate a plasma ion from said reactive gas.

10. The method according to claim 9, wherein said plasma ion is absorbed on said doping region.

11. The method according to claim 5, wherein said thermal process comprises a thermal oxidation process.

12. The method according to claim 5, wherein the thickness of said first dielectric layer is more than the thickness of said second dielectric layer.

13. A method for forming a gate device, said method comprising:

providing a silicon substrate;

forming and defining a photoresist layer on said silicon substrate;

placing said silicon substrate having said photoresist layer into a reaction chamber, and then flowing an oxygen into said reaction chamber;

performing a pulsed plasma doping process by said photoresist layer as a mask to form a doping region and an undoping region on said silicon substrate;

removing said photoresist layer;

performing a thermal oxidation process to form a first gate oxide layer on said doping region and a second gate oxide layer on said undoping region, wherein the thickness of said first gate oxide layer is more than the thickness of said second gate oxide layer; and forming a first gate on said first gate oxide layer and a second gate on said second gate oxide layer.

14. The method according to claim 13, wherein the dosage of said oxygen is about $10^{13}/cm^2$ to $10^{15}/cm^2$.

15. The method according to claim 13, wherein said pulsed plasma doping process comprises a negative bias to separate an oxygen plasma ion from said oxygen.

16. The method according to claim 15, wherein said oxygen plasma ion is absorbed on said doping region.

17. The method according to claim 13, wherein the energy of said pulsed plasma doping process is about 200 eV to 10000 eV.

18. The method according to claim 13, wherein the thickness of said doping region is less 60 Å.

19. The method according to claim 13, wherein said thermal oxidation process comprises a drying oxidation process.

20. The method according to claim 13, wherein said thermal oxidation process comprises a drying oxidation process.

21. The method according to claim 13, wherein the temperature of said thermal oxidation process is about 700° C. to 1000° C.

22. The method according to claim 13, wherein said first gate oxide layer comprises a silicon oxide.

23. The method according to claim 13, wherein said second gate oxide layer comprises a silicon oxide.

24. A method for forming a gate device, said method comprising:

providing a silicon substrate;

forming and defining a first photoresist layer on said silicon substrate;

performing a pulsed oxygen plasma doped process having a dosage about between $10^{13}/cm^2$ and $10^{15}/cm^2$ by said first photoresist layer as a mask to form a first doping region and an undoping region on said silicon substrate;

forming and defining a second photoresist layer on a partial surface of said first doping region;

performing said pulsed oxygen plasma doped process having said dosage about between $10^{13}/cm^2$ and $10^{15}/cm^2$ by said first photoresist layer and said second photoresist layer as two masks to form a second doping region on said first doping region without said second photoresist layer;

removing said first photoresist layer and said second photoresist layer;

performing a drying oxidation process to form a first silicon oxide layer on said first doping region, a second silicon oxide layer on said second doping region, and a third silicon oxide layer on said undoping region; and forming a first poly gate on said first silicon oxide layer, a second poly gate on said second silicon oxide layer, and a third poly gate on said third silicon oxide layer.

25. The method according to claim 24, wherein the surface of said first doping region comprises an oxygen plasma ions.

26. The method according to claim 24, wherein the surface of said second doping region comprises an oxygen plasma ions.

27. The method according to claim 24, wherein the energy of said pulsed plasma doping process is about 200 eV to 10000 eV.

28. The method according to claim 24, wherein the thickness of said first doping region is about less than the thickness of said second doping region.

29. The method according to claim 24, wherein the temperature of said drying oxidation process is about 700° C. to 1000° C.

30. The method according to claim 24, wherein the thickness of said second silicon oxide layer is about more than the thickness of said first silicon oxide layer.

31. The method according to claim 24, wherein the thickness of said first silicon oxide layer is about more than the thickness of said third silicon oxide layer.

* * * * *